United States Patent [19]
Tokuyama et al.

[11] Patent Number: 4,736,198
[45] Date of Patent: Apr. 5, 1988

[54] MULTI-COLOR LIQUID CRYSTAL DISPLAY SYSTEM

[75] Inventors: Keiichi Tokuyama, Katsuta; Seiji Suda, Mito; Osamu Igarashi, Katsuta; Hirohisa Yamamura, Hitachiota; Kouzo Katogi; Hiroshi Ito, both of Katsuta; Masaru Kugo, Ibaraki; Kazuhiko Sato, Katsuta, all of Japan

[73] Assignee: Hitachi, Ltd., Tokyo, Japan

[21] Appl. No.: 737,874

[22] Filed: May 28, 1985

[30] Foreign Application Priority Data

| May 25, 1984 | [JP] | Japan | 59-104623 |
| Jul. 4, 1984 | [JP] | Japan | 59-137203 |
| Jul. 13, 1984 | [JP] | Japan | 59-144301 |
| Jul. 13, 1984 | [JP] | Japan | 59-144302 |

[51] Int. Cl.⁴ .................................. G09G 3/00
[52] U.S. Cl. ....................... 340/701; 340/702; 340/753; 350/339 F
[58] Field of Search .......... 340/701, 702, 703, 753, 340/754, 765, 815.1, 784; 358/59, 241, 253; 350/339 F

[56] References Cited

U.S. PATENT DOCUMENTS

| 3,840,695 | 10/1974 | Fischer | 358/61 |
| 3,924,227 | 12/1975 | Stolor | 340/702 |
| 4,410,887 | 10/1983 | Stolor et al. | 340/784 |
| 4,450,440 | 5/1984 | White | 340/753 |
| 4,579,424 | 4/1986 | Matsukawa et al. | 350/339 F |
| 4,601,546 | 7/1986 | Ohta | 350/339 F |
| 4,636,782 | 1/1987 | Nakamura et al. | 340/753 |
| 4,642,619 | 2/1987 | Togashi | 340/703 |
| 4,642,628 | 2/1987 | Murata | 340/703 |

FOREIGN PATENT DOCUMENTS

| 54-122996 | 9/1979 | Japan | 340/702 |
| 2130781 | 6/1984 | United Kingdom . | |

*Primary Examiner*—Gerald L. Brigance
*Attorney, Agent, or Firm*—Antonelli, Terry & Wands

[57] ABSTRACT

A liquid crystal display panel including transparent electrode pairs confronting each other with liquid crystal substance disposed therebetween. At least one of each electrode pair is split into thin line electrode strips with color filters of several kinds of color being disposed thereon or on corresponding positions on the opposite electrode. The panel produces a display in an arbitrary color through the application of a certain combination of color signals between the electrodes selectively.

18 Claims, 15 Drawing Sheets

MULTI-COLOR LIQUID CRYSTAL DISPLAY SYSTEM

BACKGROUND OF THE INVENTION

The present invention relates to a liquid crystal display system and, particularly, to a liquid crystal display system used for displaying numeric, alphabetic and symbolic characters and graphic patterns as well.

Because of its compactness, liquid crystal display systems are used in many fields. For example, in the field of vehicles, liquid crystal display systems are used instead of conventional indicates instruments of vehicles, as disclosed in Japanese Patent Application Laid-open No. 54-158953.

While the liquid crystal display system has advantages with respect to other display system in that it is of small size and light weight, color display is difficult. To cope with this matter, the liquid crystal display device used for the vehicle instrument panel is attached by color filters in the shape of a displayed pattern on the glass surface of the device during the fabricating process. In this method, however, the color of a displayed pattern is always determined by the color of the filter.

Liquid crystal color television sets are available on the market. In such televisions, images are displayed by means of rapid scanning of a dot-matrix screen, and large number of electrode lead lines are required. The number of dot matrices increases in proportion to the increase in the size of display area, and the number of electrode lead lines increase accordingly. Therefore, it is practically difficult to to display a large sized image, and this system is rarely used for the display device installed on the vehicle.

SUMMARY OF THE INVENTION

An object of this invention is to provide a liquid crystal display system which operates with a simple circuit and yet is capable of changing the display color.

The inventive system includes the feature that at least one of the confronting electrodes for driving the liquid crystal is split into thin line electrode strips and these line electrode strips or the opposing electrodes are provided cyclically with filters of several colors in a certain alignment order. In the system, a display control circuit provides a drive circuit with display signals carrying pattern information and color information. The drive circuit operates to select segments of a display pattern, and also activate selectively line electrode strips constituting the segments in accordance with the color information. A simple display pattern may consist of a single segment, while a complex display pattern is made up of many segments. Electrode strips of more than one color may be selected in time-sharing so that neutral tints can be produced. Moreover, switching time (driving time) of electrodes may be controlled variably on a time-sharing basis, whereby the tone of color and brightness of display can be controlled precisely.

DESCRIPTION OF THE PREFERRED EMBODIMENTS

Figure 2:
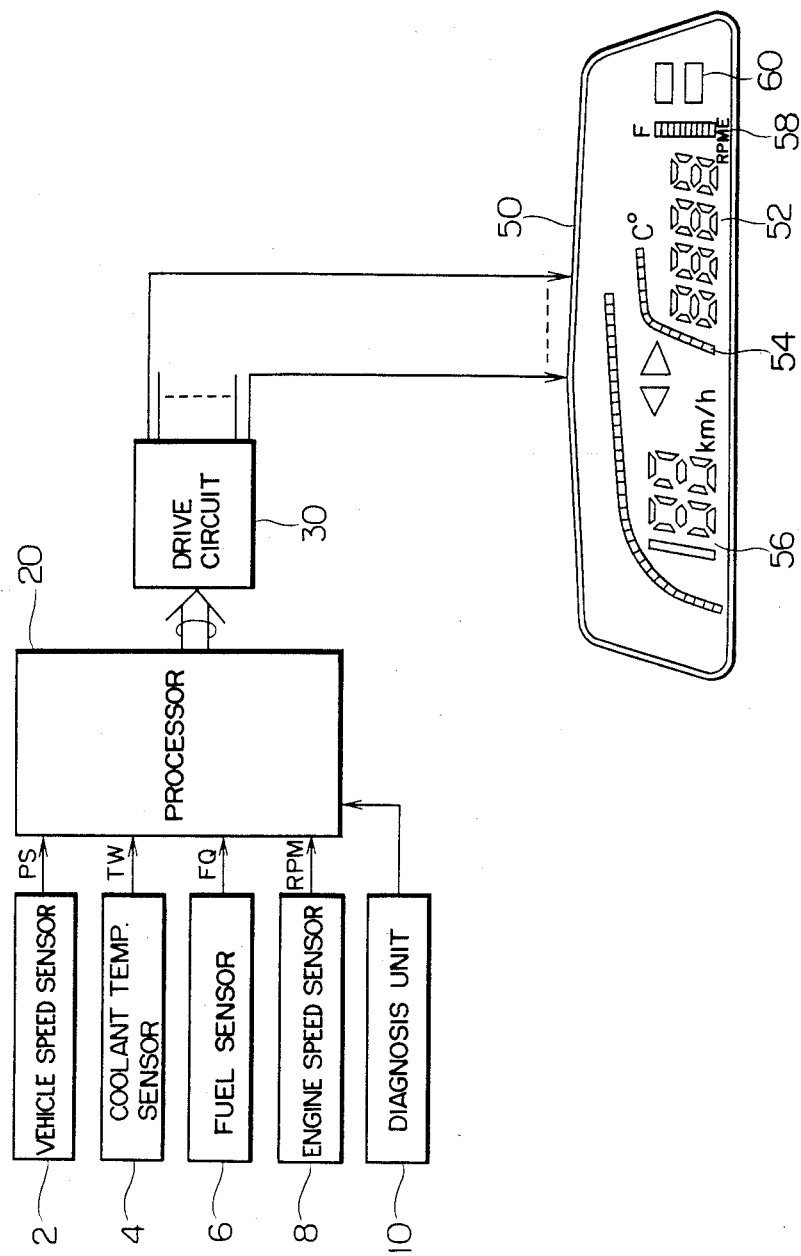
FIG. 2 is a general block diagram showing an embodiment of this invention.

An overall measurement and display system for a vehicle shown in FIG. 2 includes a vehicle speed sensor 2, an engine coolant temperature sensor 4, a fuel quantity sensor 6 and an engine speed sensor 8, each providing a pulse train PS representing the vehicle speed, a voltage TW representing the coolant temperature, a voltage FQ representing the remaining fuel quantity and a pulse train RPM representing the engine speed.

A diagnostic unit 10 is provided for detecting abnormalities in the engine control system, air conditioner controller, device activated signal transmission system and various switches installed on the vehicle, and the diagnostic signals are delivered to a digital or computer or processor 20. The processor 20 incorporates an A/D converter and pulse counter for digitizing the analog voltage signals TW and FQ and evaluating the vehicle speed and engine speed by counting the pulse trains PS and RPM for a certain period. The processor 20 delivers the measurement data in a set of display signals to a drive circuit 30. The drive circuit 30 provides a liquid crystal panel 50 with the drive signals for selecting segments for a display pattern and selecting line electrodes associated with the segments so that the pattern is displayed in a specified color. The liquid crystal panel 50 consists of a pattern section 52 for displaying the engine speed, a pattern section 58 for the fuel quantity, a pattern section 56 for the vehicle speed, a pattern section 54 for the coolant temperature, and a pattern section 60 for displaying the diagnostic result.

Figure 3:
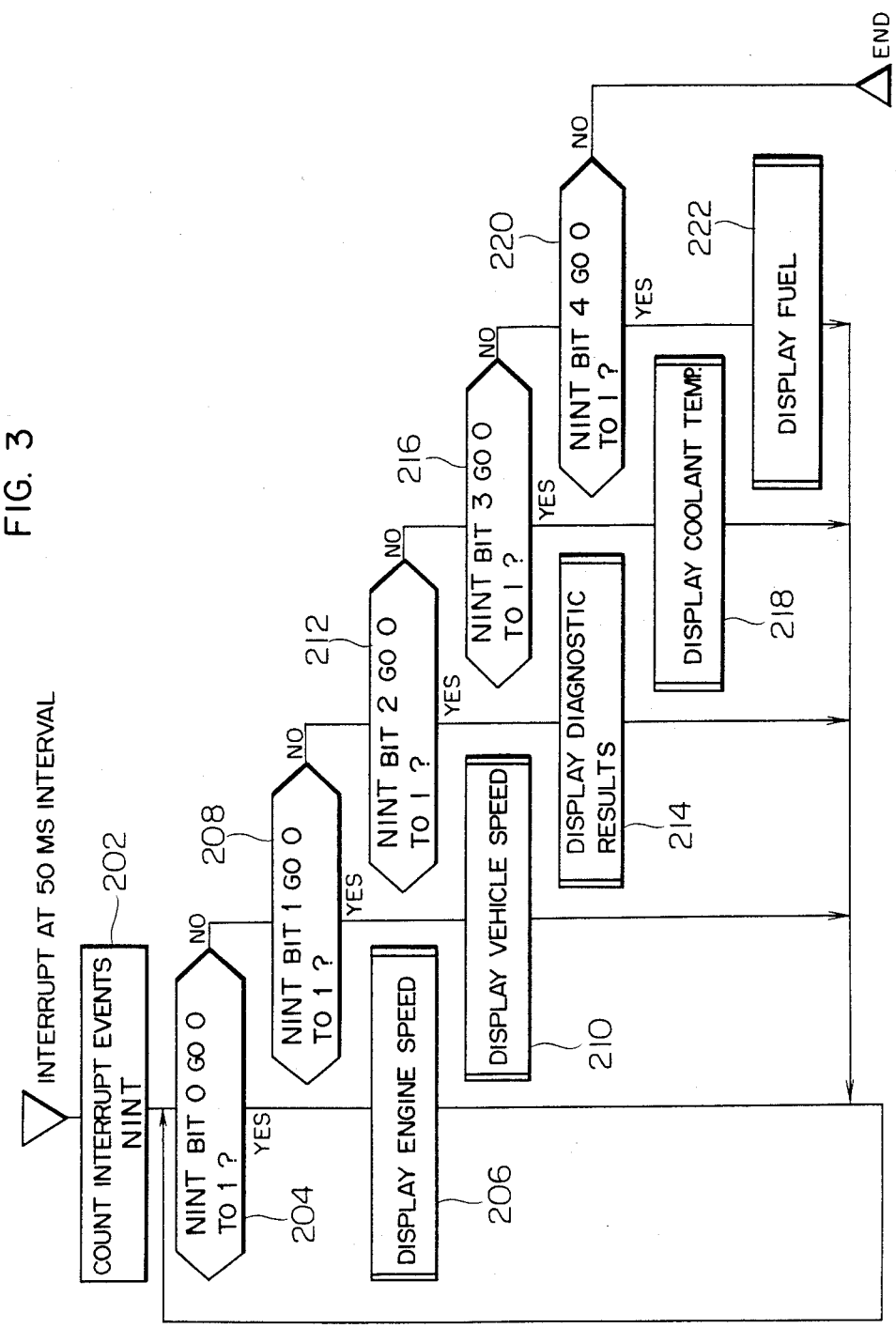
FIG. 3 is a flowchart showing the system program.

FIG. 3 shows in flowchart the operation of the processor 20, in which step 202 is executed in response to the interrupt request at 50 ms interval, and the number of interrupt occurrences is counted in this step. After the binary count has reached the maximum value of "11111", it returns to "00000" at the next interrupt request, and the count operation continues.

Step 204 detects the transition of bit 0 (lowest order bit) of the count from "0" to "1", and the sequence proceeds to step 206. Accordingly, step 206 is executed at every 100 ms. The step 206 is processed by a subroutine program as will be described later.

Upon completion of step 206, the sequence returns to step 204. Bit 0 of the interrupt count has been detected to be "1", and a negative decision is made at this time, causing the sequence to proceed to step 208. This step detects the transition of bit 1 of the interrupt count, NINT, from "0" to "1", so that the execution period of subroutine 210 is determined. Namely, the subroutine of step 210 is executed at every 200 ms.

Similarly, step 212 detects the transition of bit 2 of NINT from "0" to "1", while step 216 and step 220 detect the transition of bit 3 and bit 4 of NINT from "0" to "1". In response to affirmative decisions in these steps, respective subroutines in steps 214, 218 and 222 are executed. Namely, the subroutines of steps 214, 218 and 222 are executed in periods of 400 ms, 800 ms and 1600 ms, respectively.

As described above, the decision steps 204, 208, 212, 216 and 220 detect the transition of values at every bit position of the interrupt count NINT, and execute the corresponding subroutines as will be described later. Once a subroutine has been executed, a related decision step makes negative decision(s) from the next decision cycle, and it makes an affirmative decision upon detection of a transition to "1" following the inherent period.

Figure 4:
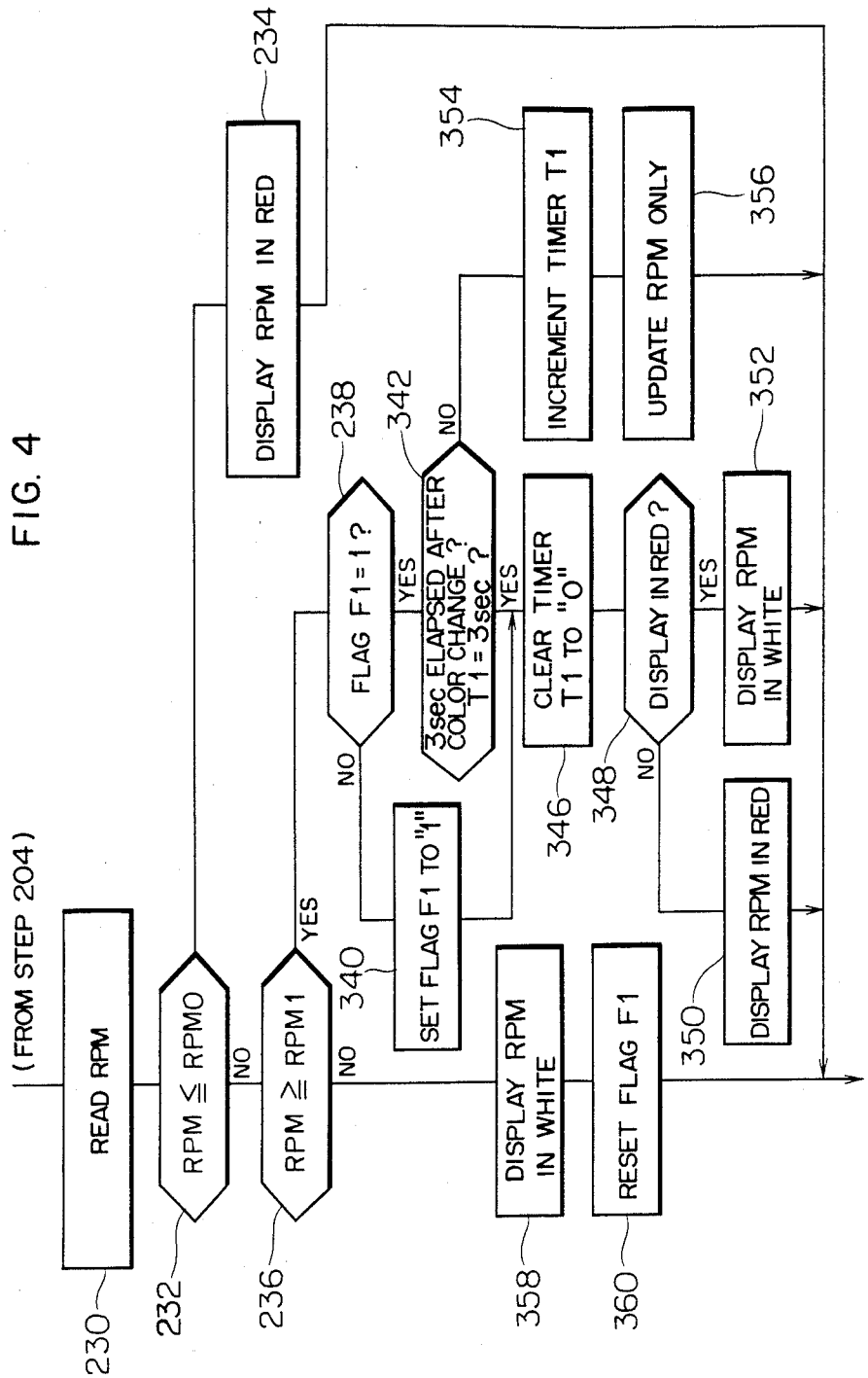
FIG. 4 is a flowchart showing the subroutine for processing the engine speed.

FIG. 4 shows the detailed process of the subroutine step 206.

The first step 230 reads the counter in the processor 20 for the count RPM of output pulses from the sensor 8 shown in FIG. 2, and the subsequent step 232 tests as to whether the engine is operating. If the count is below the preset value RPM0, the engine is assumed to be halting or cranking, and in this case the sequence proceeds to step 234, in which display signals are sent to the drive circuit so that the count RPM fetched from the counter is set in the pattern register 502 and a "red" flag is set in the color register 504 thereby to display the RPM value in red. If the count RPM is larger than RPM0 in step 232, the engine is found running, and the sequence proceeds to step 236. Step 236 compares the count RPM with the preset value RPM1, and if RPM is larger than RPM1, indicating an excessive engine speed, the sequence proceeds to step 238 for displaying the alarm. Step 238 tests the flag F1 to find as to whether the critical state of engine has been continuing. If the flag F1 is "0", indicating that the critical state is first detected in this cycle, the flag is set in step 340. Accordingly, the flag F1 will cause the step 238 of subsequent cycles to make a decision of a continuous critical state.

Step 346 set a zero value to timer data T1 stored in RAM. The timer data T1 is accessed by steps 342 and 354 for changing the display color at a 3-second interval. Step 348 tests whether the preceding display is red. In the present case, the preceding display is not red, and the sequence proceeds to step 350, in which the engine speed data RPM is set in the pattern register 502 and "red" flag is set in the color register. If, on the other hand, step 235 finds the flag F1 to be "1", indicating a continuous critical state, the display color is changed at a 3-second interval. The expiration of 3 seconds is measured by step 342 by making reference to the timer data T1. Upon expiration of 3 seconds, step 346 resets the timer data T1 to zero. The subsequent step 348 tests whether the display is red, and if it is not red, step 350 sets the engine speed data RPM to the pattern register 502 and "red" flag to the color register 504. If, on the other hand, step 348 finds the preceding display to be red, the sequence proceeds to step 352, in which the engine speed data RPM is set in the pattern register 502 and "white" flag is set in the color register 504. If a 3-second period has not yet expired from the previous color change as determined from the timer data T1 in step 342, the timer data T1 is incremented in step 354 and only the engine speed data is set in the pattern register with the color register being retained unchanged in step 356. Through the above process, the display color for the engine speed display changes red and white at a 3-second interval so long as the engine speed is in the over-speed zone.

On the other hand, when the engine is running in the normal range, the sequence proceeds from step 236 to step 358, in which engine speed data is set in the pattern register 502 and "white" flag is set in the color register 504 so that the engine speed is displayed in white. The flag F1 which has been set in step 340 is reset to "0" in step 360, indicating the restoration of the normal engine operation.

Figure 1:
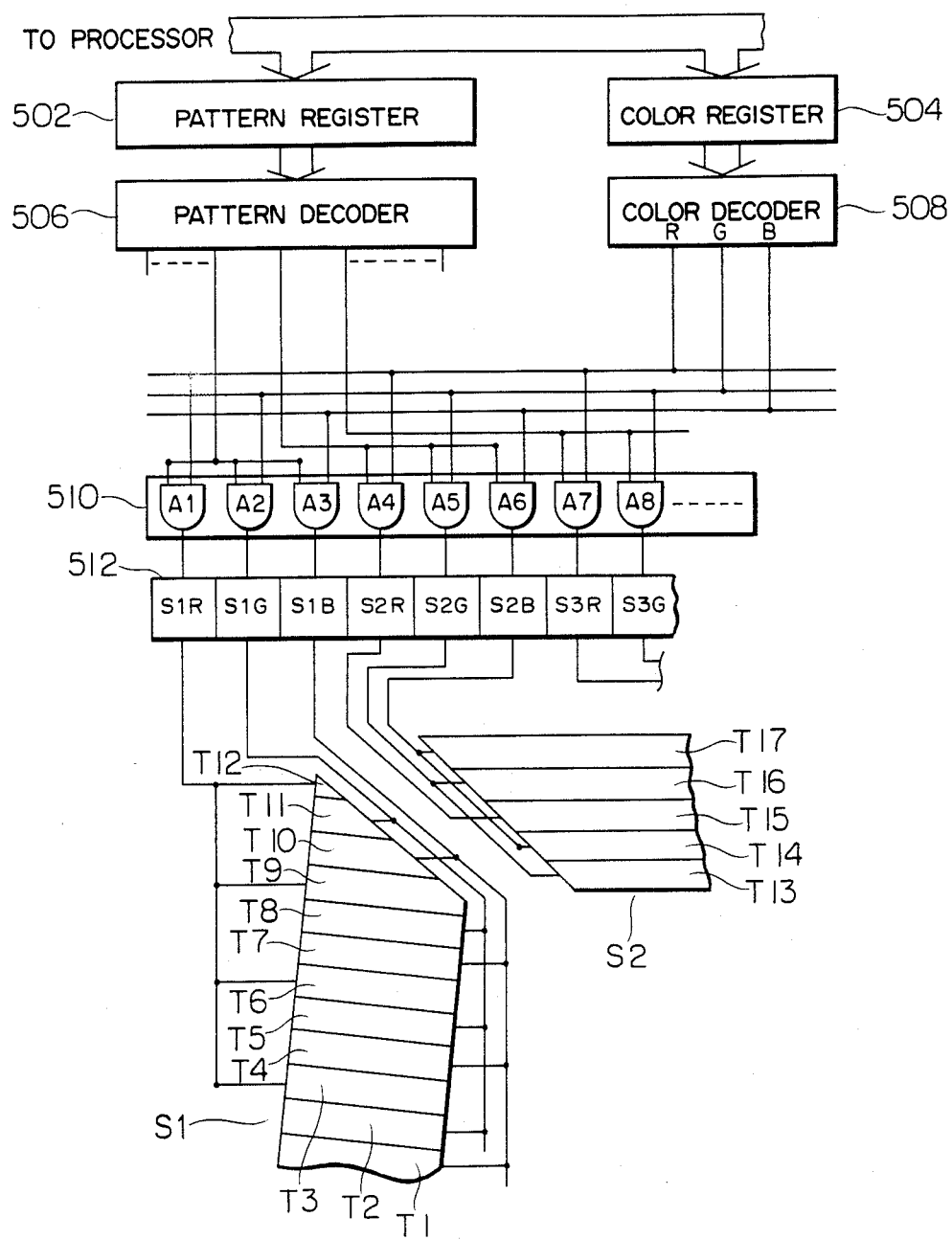
FIG. 1 is a block diagram used to explain the drive circuit of the inventive display system.

FIG. 1 shows in detail the portions of the drive circuit 30 and liquid crystal panel 50 in FIG. 2 for displaying the engine speed. Among the computational results through the processing shown in FIG. 4, the engine speed data is set in the pattern register 502, and it is fed to the decoder 506 by which segment signals for activating segments, such as S1 and S2, constituting the display pattern are generated. For activating segments S1 and S2, the pattern decoder 506 provides "1" signals to AND gates A1, A2, A3, A4, A5 and A6 in the AND gate unit 510.

At the same time, the color register 504 receives color data produced in the process of FIG. 4, and it is fed to the color decoder 508 by which color control signal(s) are generated. When a "white" flag is set in the color register 504, the decoder 508 produces a red signal R, green signal G and blue signal B. AND gates A1 through A6 are enabled in response to the output signals from the decoders 506 and 508 to activate drivers S1R, S1G, S1B, S2R, S2G and S2B in the driver unit 512, which in turn supply a voltage to all line electrodes T1 through T17. Consequently, the segments S1 and S2 are visualized in white.

The line electrodes T1 through T17 are actually very thin, but they are illustrated much wider for the explanatory purpose. As will be described in detail later, the line electrodes T1-T17 each constitute one of an electrode pair provided for the liquid crystal panel, although counter electrodes located on the other side of the liquid crystal element are not shown in the figure. The voltage application to an electrode pair causes a change in the polarization of liquid crystal, resulting in the transmission or interruption of the light. A color filter is provided on the light path of each line electrode so that the transmitted light is colored. Thus, a colored light in the form of line is produced corresponding to each line electrode, and a combination of active lines forms a color display pattern.

Although in this embodiment the light is transmitted in response to the voltage application to the electrode pair, arrangement may be made so that the light is interrupted by the voltage application. In this embodiment, a voltage application between electrodes T1, T4, T7, T10, T14 and T17 and the respective counter electrodes produces blue lines of light. A voltage application to electrodes T2, T5, T8, T11, T13 and T16 produces green lines of light, and a voltage application to electrodes T3, T6, T9, T12 and T15 produces red lines of light.

The remaining segments of a pattern are similarly made of line electrodes. Line electrodes of the same color in each segment are connected together so that the number of decoder outputs can be decreased. Although in FIG. 1 the pattern register 502 and color register 504 are illustrated separately and the pattern decoder 506 and color decoder 508 are illustrated separately, they may be integrated in each semiconductor device. The pattern register 502 and color register 504 may be arranged to share a single register so that it is accessed for reading and writing by a common address signal. Furthermore, the pattern decoder 506, color decoder 508 and AND gate unit 510 may be integrated in one unit.

Figure 5:
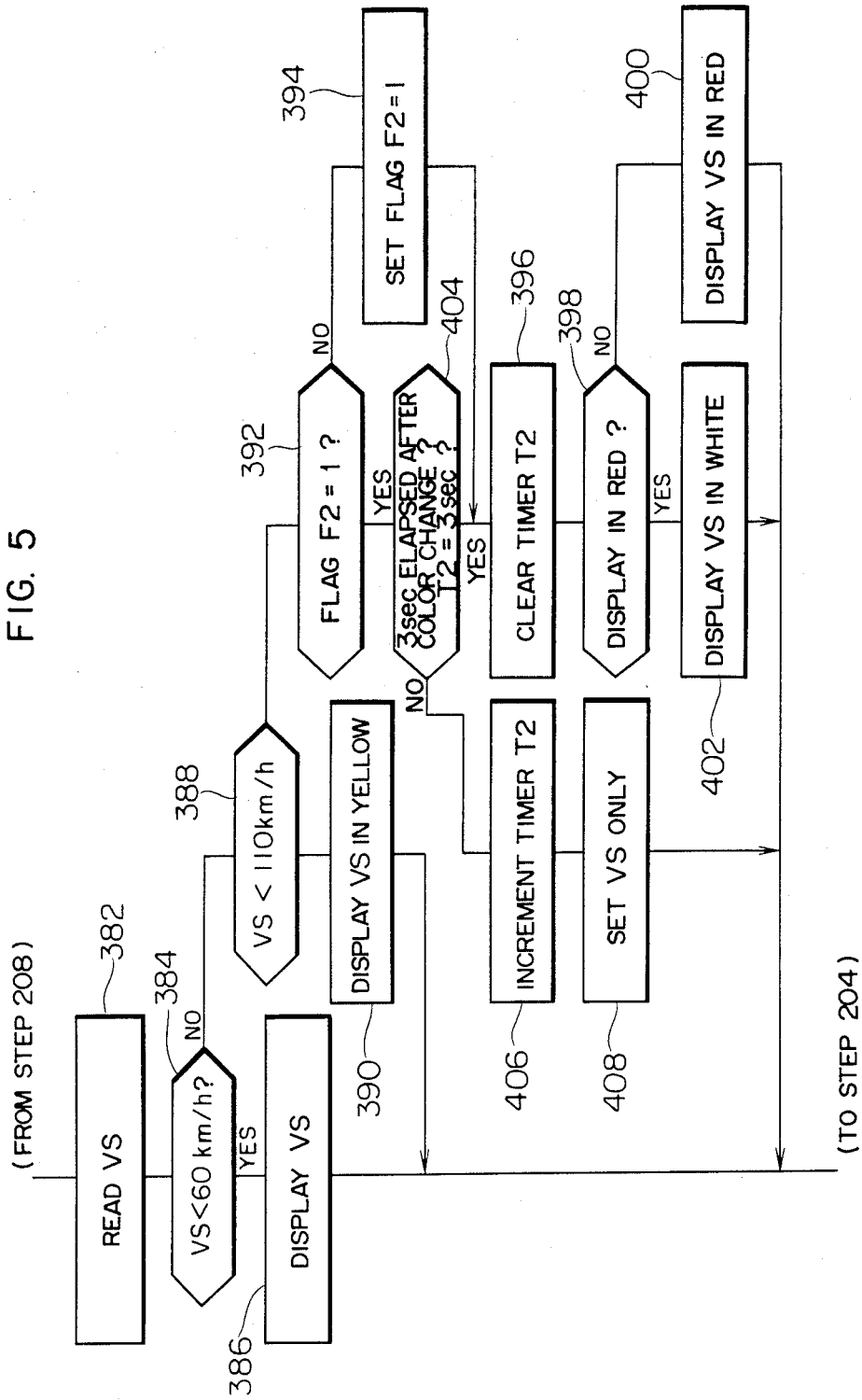
FIG. 5 is a flowchart showing the subroutine for processing the vehicle speed.

FIG. 5 shows in detail the operations of the subroutine step 210.

The first step 382 reads the vehicle speed VS measured by the counter in the processor 20 in FIG. 2, and the subsequent step 384 tests whether the vehicle speed is below 60 km/h. If step 384 has made an affirmative decision, the vehicle speed VS is set in the pattern register 542 and "white" flag is set in the color register 544 in step 386 by way of a bus line 550 in FIG. 6 so that the vehicle speed is displayed in white. For a negative decision by step 384, i.e., VS≧60 km/h, step 388 tests whether VS is below 110 km/h. If the decision is affirmative, the vehicle speed VS is set in the register 542 and "yellow" flag is set in the register 544 in step 390 so that the vehicle speed is displayed in yellow. If VS is equal or above 110 km/h, the sequence proceeds to step 392, in which the flag F2 is tested to find whether this decision is made at the first time. If this is true, the flag F2 is set in step 394, and then timer data T2 for making the blinking period is reset to zero in step 396. At first, the sequence proceeds from step 398 to step 400, in which the vehicle speed data is set in the register 542 and "red" flag is set in the register 544 so that the vehicle speed is displayed in red. In another case if the flag F2 is "1", indicating that the vehicle speed has been above 110 km/h since, the sequence proceeds from step 392 to step 404. The step 404 tests whether the display in one color has continued for 3 seconds by making reference to the timer data T2, and if the period has not yet expired, T2 is incremented in step 406. Then, in step 408, only the vehicle data VS is set in the register 542, and the color register 544 is left unchanged. If, on the other hand, expiration of 3 seconds for the same display color is detected, the timer data T2 is reset to zero for counting the subsequent 3-second period, and test is conducted as to whether the preceding display is red. If this is true, the vehicle speed VS is set in the register 542 and "white" flag is set in the register 544 in step 402 so that the vehicle speed is displayed in white. In another case if the preceding display is found white, the vehicle speed VS is set in the register 542 and "red" flag is set in the register 544. The step 210 for displaying the vehicle speed in FIG. 3 takes place in this way.

Figure 6:
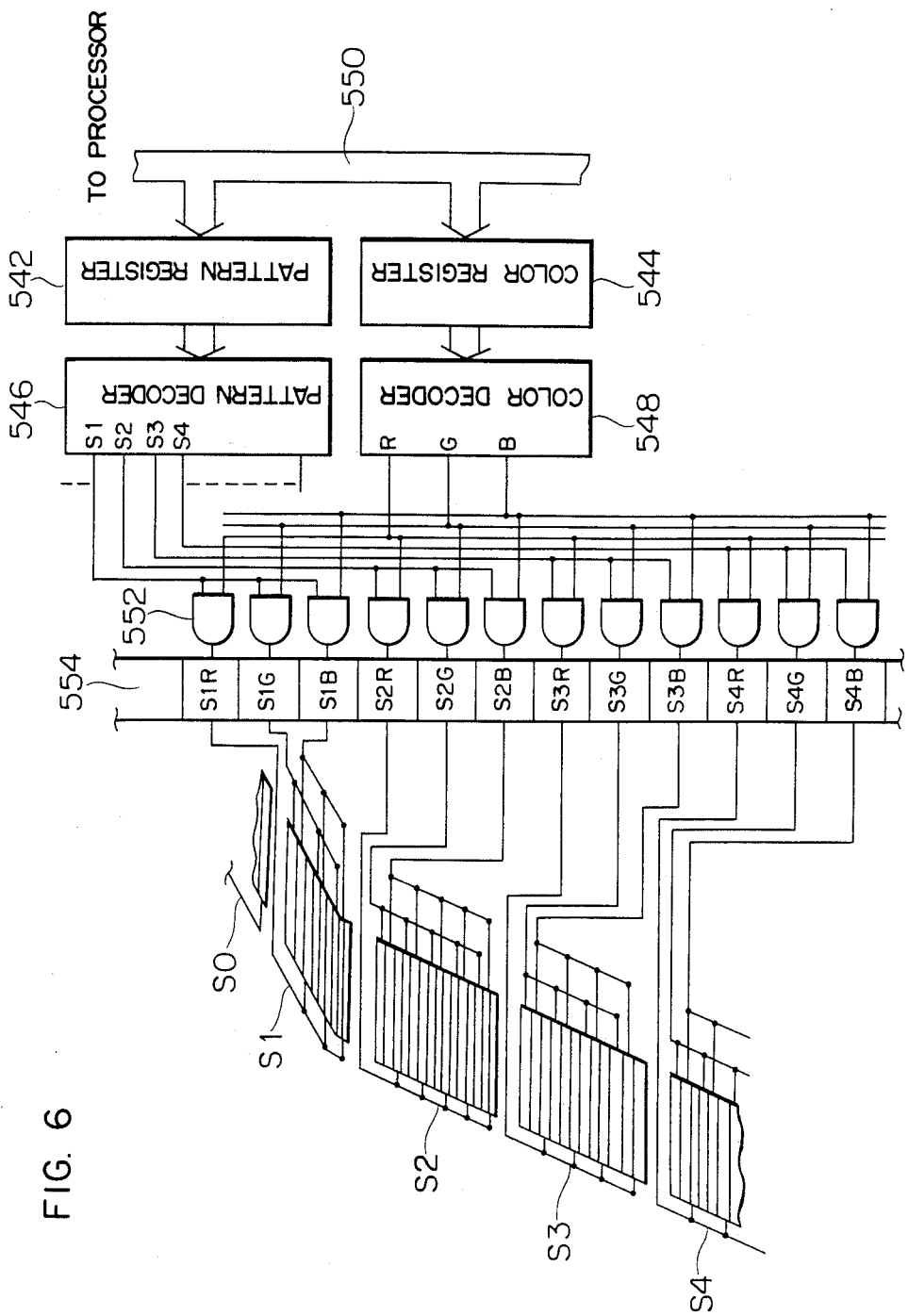
FIG. 6 is a detailed block diagram showing the portion of arrangement for displaying the vehicle speed.

FIG. 6 shows the portions of the drive circuit and liquid crystal panel shown in FIG. 2 for displaying the vehicle speed. The operation of the circuit is principally identical to the case of FIG. 1. For a graphic display of the vehicle speed, segments S0–S4 and so on are each made up of line electrodes, with electrodes of the same color within a segment are connected together, and the groups of electrodes are supplied with a voltage by corresponding drivers S1R-S4B and so on in the driver unit 554. The number of segments are determined by the resolution of displayed vehicle speed. For example, in a 1 km/h resolution, the number of segments activated increases by one for each 1 km/h increase in the vehicle speed. The number of active segments and their color are determined by display data set in the pattern and color registers 542 and 544 by the processor 20. The register 542 holds data representing the vehicle speed, and the associated pattern decoder 546 provides the AND gate unit 552 with segment selection signals in accordance with the data. At the same time, the color decoder 548 associated with the color register provides color signal(s) to the AND gate unit 552, so that the selected segments are visualized in the specified color. The decoders 546 and 548 and AND gate unit 552 may be integrated, and the registers 542 and 544 may be integrated as in the case of FIG. 1. Numeric display for the vehicle speed, as shown in FIG. 2, is achieved in the similar arrangement to that of FIG. 1 and illustration thereof is omitted in FIG. 6.

Figure 7:
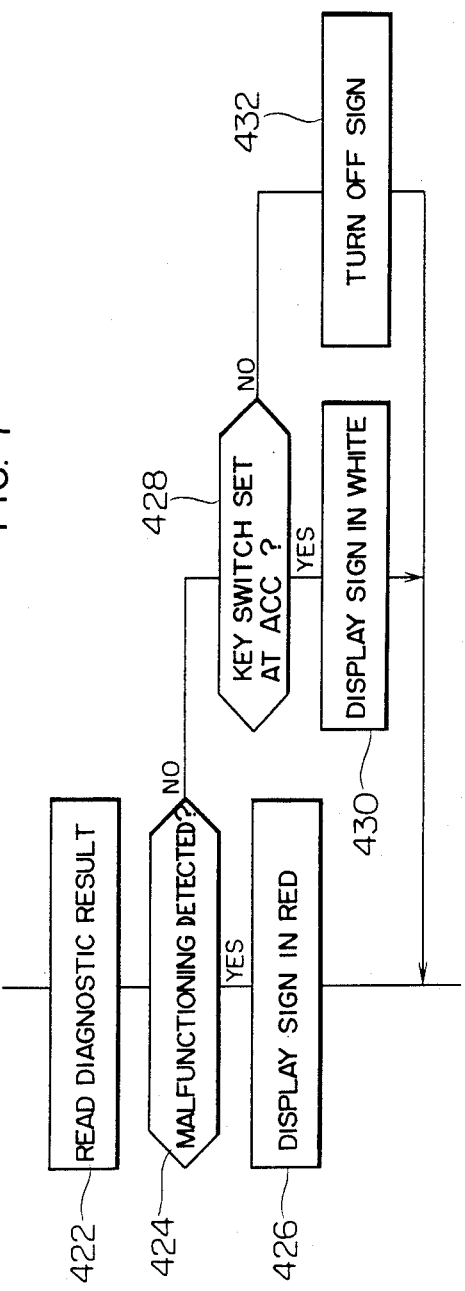
FIG. 7 is a flowchart showing the subroutine of the diagnostic process.

FIG. 7 shows in detail the processing of the subroutine step 214 in FIG. 3 for implementing the diagnostic process for the system.

The first step 422 reads the output of the diagnosis unit 10 shown in FIG. 2. The subsequent step 424 makes a decision on the occurrence of malfunctioning based on the diagnostic result provided by the unit 10. If a malfunctioning is detected, step 426 issues data to register 572 in FIG. 8 so that a red alarm is displayed. If, on the other hand, no malfunctioning is detected, a test is conducted as to whether the key switch of the vehicle is set at the accessory (ACC) position. Only when the key switch is found set at the ACC position, the entire segment for diagnosis is made white by activating all of the red, blue and green line electrodes so that the driver of the vehicle can check the display circuit and display panel. For this purpose, step 430 sets "white" flag in the register 592. When the key switch is turned out of the ACC position, the register 572 is cleared in step 432 so that the patterns are blackened.

Figure 8:
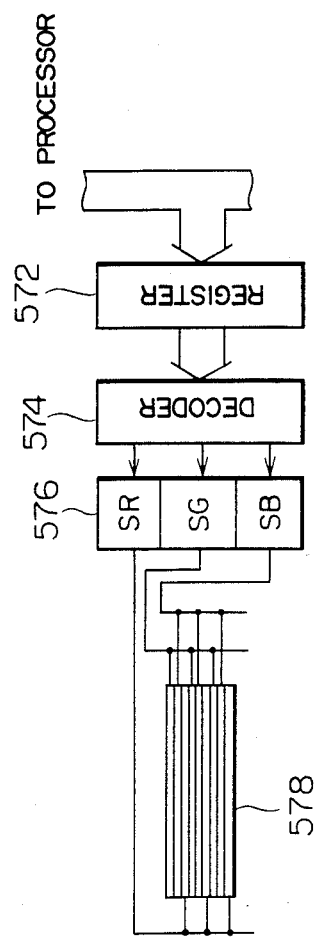
FIG. 8 is a detailed block diagram showing the portion of arrangement for displaying the malfunctionings.

FIG. 8 shows the portions the drive circuit and display panel of FIG. 2 for displaying the diagnostic result. In this embodiment, the display pattern for diagnosis consists of a single segment and, accordingly, the segment selection circuit is not needed. The color data is set in the register 572, and the associated decoder 574 provides drive signal(s) to the driver unit 576, which applies a voltage to red, blue and green line electrodes through drivers SR, SG and SB. To make display white, all line electrodes are activated.

Figure 9:
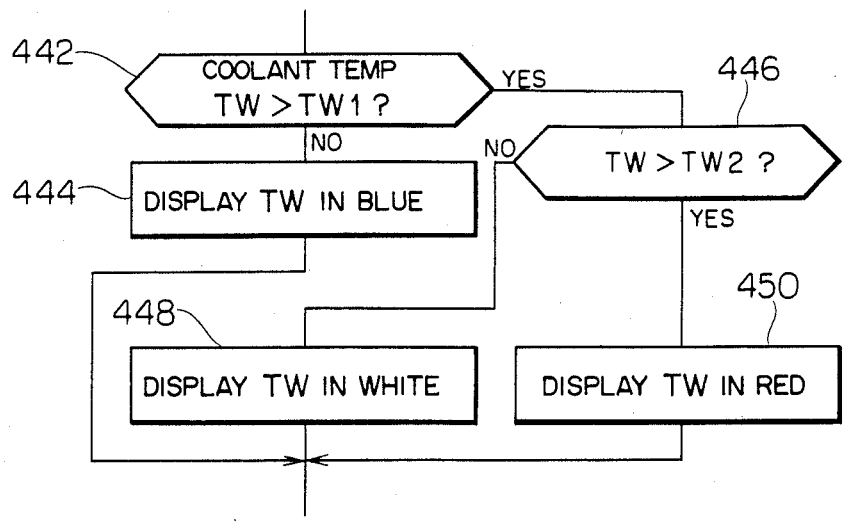
FIG. 9 is a flowchart showing the subroutine for processing the coolant temperature.

FIG. 9 shows in detail the processing of the subroutine step 218 in FIG. 3. Step 442 compares data TW from the coolant temperature sensor 4 with the preset value TW1 to check whether the engine operating temperature is too low, and, if TW is lower than TW1, step 444 provides the drive circuit with the temperature data TW and a color specification of blue. If TW is higher than TW1, step 446 compares the TW with another preset value TW2 to check whether the engine is overheating, and if TW is higher than TW2, step 450 provides the drive circuit with the temperature data and a color specification of red. When the coolant temperature is normal, i.e., between TW1 and TW2, step 448 provides the drive circuit with the temperature data and a color specification of white.

The drive circuit for displaying the coolant temperature graphically is arranged identically to that of FIG. 6, and it receives display signals to activate a certain number of segments corresponding to the coolant temperature data TW. In each segment, line electrodes are selected by the color data.

Figure 10:
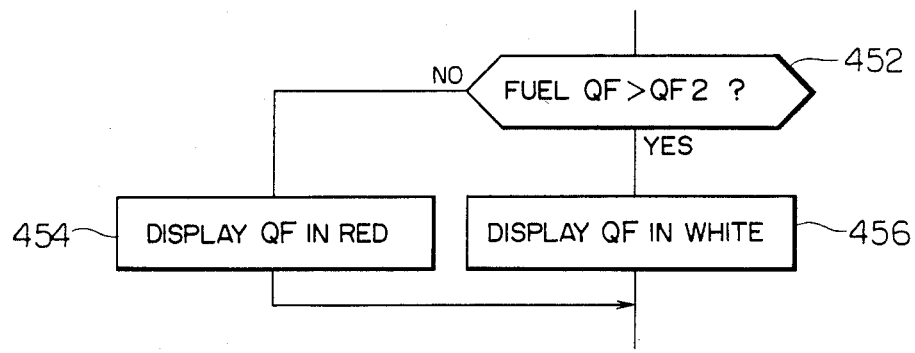
FIG. 10 is a flowchart showing the subroutine for processing the amount of fuel.

FIG. 10 shows the processing for displaying the remaining fuel quantity. Step 452 compares the output FQ of the fuel quantity sensor 6 with the preset threshold value FQ1 indicating the lower limit of fuel quantity. If FQ is smaller than FQ1, step 454 displays the fuel quantity in red; otherwise, step 456 display the fuel quantity in white.

The arrangement of the drive circuit and display panel for displaying the remaining fuel quantity graphically is identical to that of FIG. 6. Segments to be activated are determined by the fuel quantity data, and line electrodes in each segment are selected by the color data provided by the decision step 454 or 456. Thus, a voltage is applied to the selected line electrodes of the selected segments.

Figure 11:
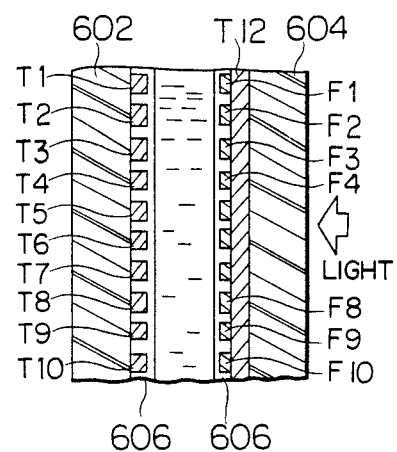
FIG. 11 is a cross-sectional view of the liquid crystal display panel embodying the present invention.

FIG. 11 is a sectional view of the liquid crystal panel shown in FIG. 2. Each segment is constructed of transparent line electrodes T1-T10 provided on the surface of one glass plate 602 and a common electrode T12 provided on the surface of another glass plate 604, with liquid crystal substance being sealed between the confronting electrodes. The common electrode T12 is provided thereon with color filters F1-F10 confronting the line electrodes T1-T10 in a cyclic arrangement of red, green and blue colors, e.g., F1 is a red filter, F2 is a green filter and F3 is a blue filter. When the voltage is applied between the electrode T1 and the common electrode T12, the polarization of liquid crystal between the electrodes varies, causing the light in a width of the line electrode T1 to be transmitted between the glass plates 602 and 604. The transmitted light is visible in red by the effect of the filter F1. In the same way, application of a voltage between electrodes T2 and T12 produces a line of green light. Because of thin electrodes arranged closely, the light transmitted through different filters is visible in a composite color. Accordingly, when all electrodes are activated, a red, green and blue lights intermix, resulting in a composite color of white.

Figure 12:
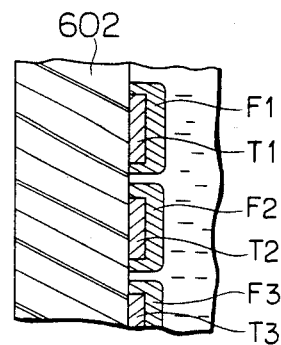
FIG. 12 is a cross-sectional view showing another embodiment of the liquid crystal display panel.

FIG. 12 shows another embodiment of the liquid crystal panel. In this arrangement, color filters are provided on line electrodes T1-T3 and so on the surface of a glass plate 602. Namely, these transparent electrodes are covered with a color film (color base) made of gelatin. The arrangements of FIGS. 11 and 12 are further provided with polarization films 606 on the surface of the electrodes and color filters, but the explanation for these known members is omitted. The manufacturing process of the color filter consists of a step of color base application, a step of baking and development, a step of coloring, and a step of drying.

Figure 13:
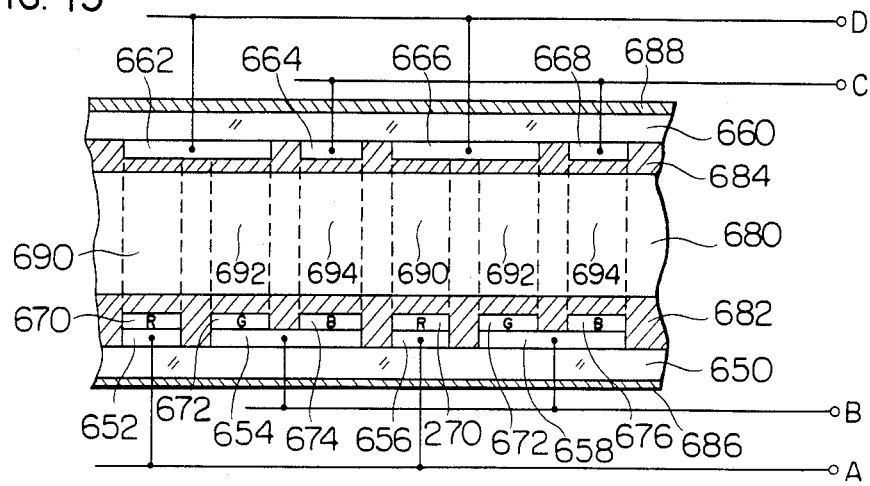
FIG. 13 is a cross-sectional view showing still another embodiment of the liquid crystal display panel.

FIG. 13 is a further embodiment of the inventive display panel, showing the cross section of line electrodes in one of several segments in a liquid crystal display panel. Line electrodes 652, 654, 656 and 658 are provided over a lower glass plate 650, and line electrodes 662, 664, 666 and 668 are provided over an upper glass plate 660. The upper electrodes and lower electrodes are out of alignment by half the electrode width, whereby each line electrode functions as two line electrodes of the previous embodiments. Some of the electrodes are connected together internally so that the number of lead-out terminals is further decreased.

Among the line electrodes, 652 and 656 are provided with red filters 670 and 270, electrode 654 is provided with a green filter 672 and blue filter 674, and electrode 658 is provided with a green filter 672 and blue filter 676. In this embodiment, the electrode width is made equal to twice the filter width plus a spacing for insulation, except for some electrodes such as 652 and 656 which have the same width as of the filter.

In the periphery of the upper and lower electrodes, there are provided polarization films 682 and 684 for polarizing the liquid crystal substance 680. The exterior surfaces of the glass plates 650 and 660 are provided with polarizing plates 686 and 688 with the light absorption axes set in the same direction. When the voltage is absent on the electrodes, the axis of the light is turned by the liquid crystal so that all of the light is absorbed and no light is transmitted. On the other hand, when the voltage is applied to the electrodes, the liquid crystal between the electrodes does not turn, allowing the transmission of the light without changing its axis. The transmitted light is colored by the filter. This principle is also applicable to the preceding embodiments, although the polarization plates and films are omitted in FIGS. 11 and 12.

Figure 14:
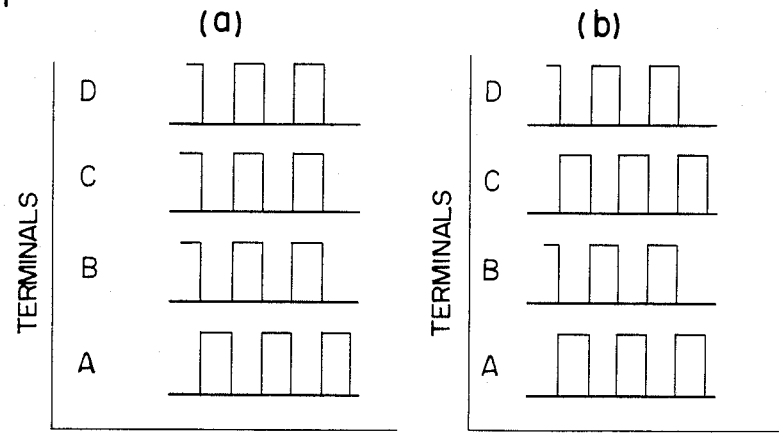
FIG. 14 is a diagram used to explain the operation of the panel shown in FIG. 13.

Application of rectangular voltage waveforms between electrodes of each segment produces a display of not only a single color, but the intermediate tone of color. The display operation will be explained with reference to FIG. 14. FIG. 14 (a) shows a set of drive voltage waveforms for producing a display in red. Terminal A is supplied with a voltage waveform having an opposite phase relationship with those applied to terminals B, C and D, and consequently a voltage difference is produced only between the electrodes 670 and 662. As a result, the light is transmitted only in a portion 690 of the liquid crystal through the red filter 670.

FIG. 14 (b) is the case of producing a composite color using red and blue. Voltage waveforms having an opposite phase relationship are applied to terminals A and C and to terminals B and D, and the light is transmitted in a portion 690 of the liquid crystal related to the terminals A and D and in a portion 692 related to the terminals B and C. In the same way, by application of voltage waveforms having an opposite phase relationship to the terminals B and D, a portion 694 of the liquid crystal transmits the light. Accordingly, by controlling the transmission of light through the filters 670, 672 and 674, the color of a segment can be manipulated. The following Table 1 shows the phase relationship between voltage pulses applied to the terminals A, B C and D, and the resultant color of a segment.

TABLE 1

| | Display color | | | | | | | |
|---|---|---|---|---|---|---|---|---|
| Terminal | Black CLO1 | Red CLO2 (R) | Green CLO3 (G) | Red CLO4 (B) | Yellow CLO5 (R·G) | Blue-green CLO6 (G·B) | Purple CLO7 (B·R) | White CLO8 (R·G·B) |
| A | 0 | 0 | 0 | 0 | 0 | 0 | 0 | 0 |
| B | 0 | 1 | 1 | 0 | 0 | 1 | 1 | 0 |
| C | 0 | 1 | 1 | 1 | 0 | 0 | 0 | 1 |
| D | 0 | 1 | 0 | 0 | 1 | 0 | 1 | 1 |

The table shows the voltages at terminals B, C and D observed at a time point when terminal A is given a low voltage, with symbol "0" represents the application of common phase voltage pulses, while symbol "1" representing the application of opposite phase voltage pulses.

The circuit arrangement and operation for driving the liquid crystal panel shown in FIG. 13 will be described with reference to FIG. 15 and FIG. 6. Segments S1 and S2 are part of a display pattern for displaying the vehicle speed in a line graph fashion, and the speed is expressed in the length of the displayed line which is determined by the number of active segments. Segments to be activated are selected in accordance with the vehicle speed data held in the pattern register 542. As mentioned previously, the vehicle speed is decoded by the pattern decoder 546, which provides drive signals to the corresponding segments. Signals indicated by (B), (C) and (D) are produced in response to data in the color register, as will be described in the following, and these signals are to produce voltage pulses applied to the terminals A, B, C and D.

The color set shown in Table 1 are assigned with numbers 1 through 8 in the order of black to white, and one of these numbers is set in the color register 544. The set number produces a signal representing "black", "red", "green", ..., or "white" on lines 722, 724, 762, ..., or 736. In the figure, patterns "o" placed on the intersection of the matrix represents a part of a logical AND gate formed, for example, of an FET. Each of the lines 722–736 is arranged in a serial connection of eight FETs with their gates receiving bit 0 through bit 3 of the output from the register 544 and inverted version thereof in a certain combination. Each transistor becomes conductive between its source and drain electrodes in response to a high-level input signal at its base. Intersections of the matrix without patterns "o" are made conductive fixedly on the FETs irrespective of the gate voltage, while intersections with patterns "o" have their conductive states depending on the gate voltage. Accordingly, the level of the lines 722–736 is determined from the conductive states of all serial FETs in each line, i.e., an AND condition for the outputs of the color register. Depending on the outputs on the lines 722–736, the signals (B), (C) and (D) are produced on lines 774, 776 and 778, the relation of which is listed in Table 1. The matrix arrangement between the lines 774–778 and the lines 772–736 and their inverted versions functions as an encoder, or it can be considered as a memory for storing the conditions listed in Table 1. The conditions of Table 1 can be changed by moving AND gates symbolized by "o" on the matrix. One of the symbols, e.g., "1", in Table 1 corresponds to the pattern "o" on the matrix.

Each of the lines 774, 776 and 778 consists of a serial connection of 16 FETs, with some of FETs being made conductive fixedly between the source and drain electrodes correspondingly to the intersections without patterns "o". The lines 772–736 and their inverted versions are connected to the gate electrodes of the FETs, and their states of conduction are determined by the signal level of these input lines. The FETs at intersections without patterns "o" are conductive unconditionally. By the foregoing arrangement, the signals (B), (C) and (D) are produced on the lines 774, 776 and 778, and these signals are supplied to the inputs of exclusive-OR gates 782, 784 and 786.

The exclusive-OR gates 782, 784 and 786 receive on their one inputs the signal (A) generated by a pulse generator 780, and receive on their another inputs the signals (B), (C) and (D) produced on the lines 774, 776 and 778, respectively. When the signals (B), (C) and (D) are high, the exclusive-OR gates 782, 784 and 786 transmit the signal (A) in the opposite polarity, while when the signals are low they transmit the signal (A) in the same polarity. Accordingly, the exclusive-OR gates provide outputs against the input signal (A) as shown in Table 1.

The outputs of the exclusive-OR gates together with the signal (A) are fed to one input terminals of AND gates 792, 974, 796 and 798, which also receive on another input terminals signals from the pattern decoder 546 and provide pulse outputs on terminals A, B, C and D as a result of logical AND condition. Consequently, display data which has been set in the pattern register 542 by the processor is displayed in a pattern in a color specified by color data which has been set in the color register 544 by the processor. Although in the foregoing embodiment the pattern decoder and color decoder are provided separately, they may be arranged integrally.

Figure 15:
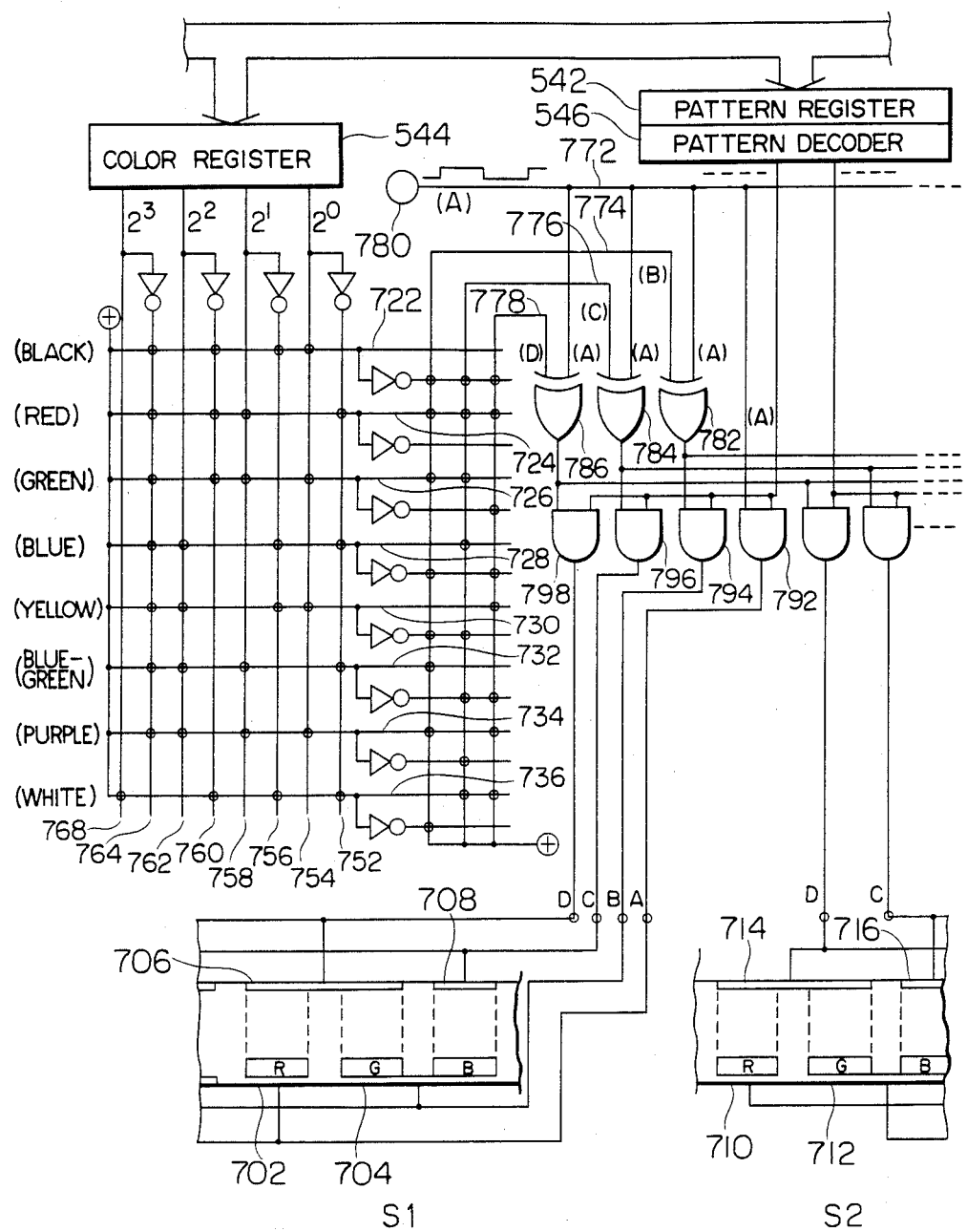
FIG. 15 is a block diagram showing another embodiment of the drive circuit.
Figure 16:
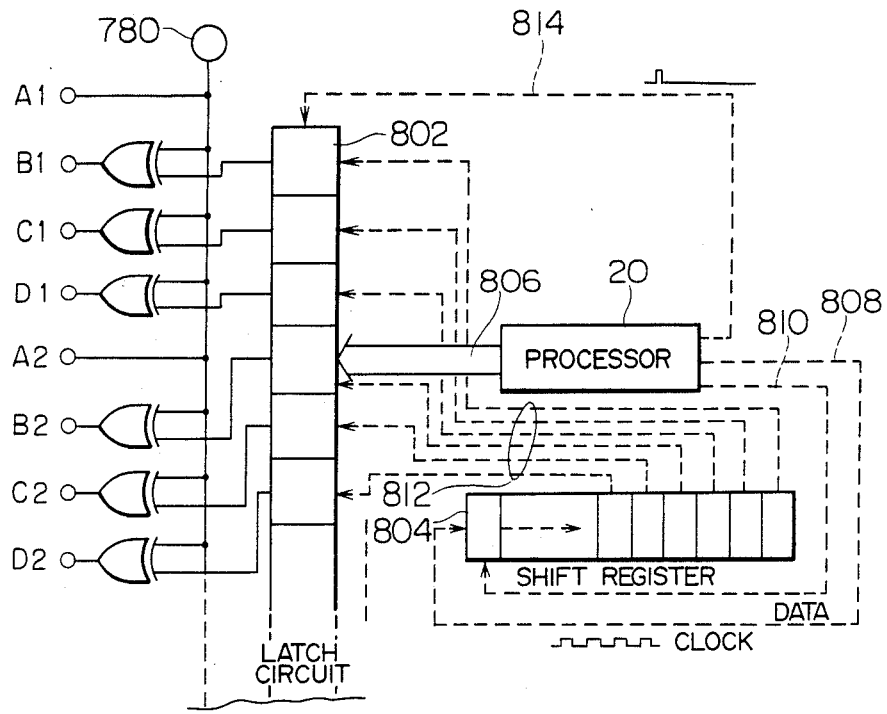
FIG. 16 is a block diagram showing still another embodiment of the drive circuit.

The logical relationship of Table 1, which is achieved by the circuit arrangement of FIG. 15 as described above, can also be attained mainly by the software technique. FIG. 16 shows the circuit arrangement and FIG. 17 shows the program for implementing the function.

In FIG. 16, a processor 20 sets signals in a latch register 802 correspondingly to the terminals A, B, C and D of each segment. The outputs of the latch register 802 produce signals at terminals B1, C1, ..., D2, and these signals are delivered to the terminals A, B, C, and D of the respective segments. Each exclusive-OR gate transmits the pulse signal at terminals A1 in opposite polarity in response to a high input set in the corresponding bit of latch register, while it transmits the pulse signal in the same polarity in response to a low input, as in the case of FIG. 15. The signal paths shown by the dashed lines in FIG. 16 are used for a processor having only serial output ports for carrying out parallel data transfer to the latch register 802 by use of a shift register.

The operation of the circuit arrangement of FIG. 16 by the program will be described with reference to the flowchart in FIG. 17. The processing shown in FIG. 17 is added next to each display step in the flowcharts of FIGS. 4, 5, 7, 9 and 10. In FIG. 4, for example, pattern data and/or color data is set in the drive circuit in steps 350, 352 and 356. Whereas in the new arrangement, instead of setting the data in the drive circuit in these steps, the data is received by the program of FIG. 17. More specifically, the data is set in RAM addressed by the program of FIG. 17. Namely, the pattern register and color register are substituted by a RAM. This principle is equally applicable to the flowcharts of FIGS. 5, 7, 9 and 10.

Figure 17:
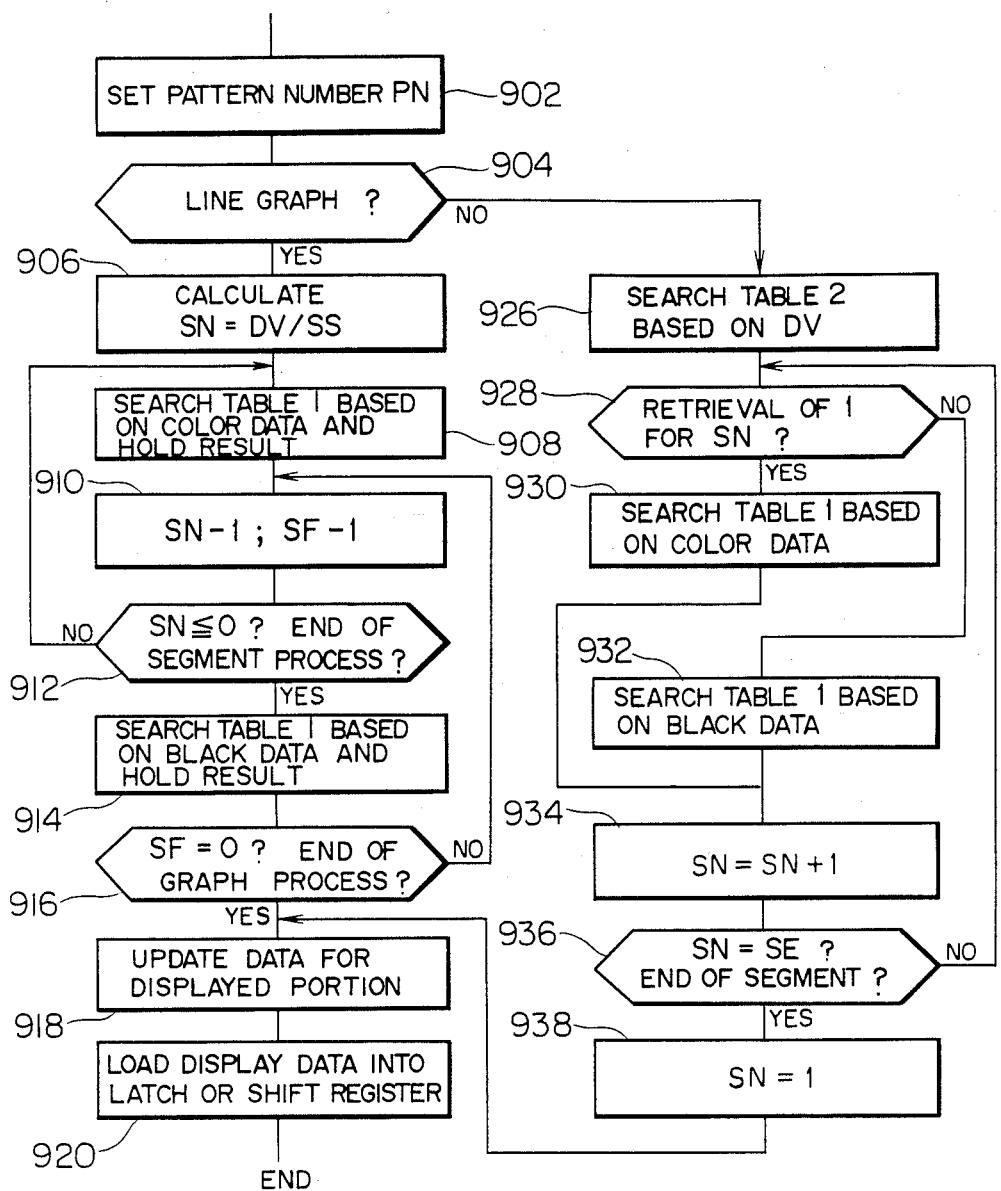
FIG. 17 is a flowchart showing the operation of the circuit arrangement shown in FIG. 16.

The first step 902 in FIG. 17 sets the pattern number of a pattern to be processed. The pattern number PN is given for the display panel shown in FIG. 2 such that the line graph pattern for the vehicle speed is given PN=1, the numeric pattern for the vehicle speed is PN=2 the left-turn sign pattern is PN=3, the right-turn sign pattern is PN=4, the coolant temperature graphic pattern is PN=5, the engine speed numeric pattern is PN=6, the fuel quantity graphic pattern is PN=7, and the diagnosis sign patterns are given PN=8 and PN=9.

Assuming the process for displaying the coolant temperature following the processing of FIG. 9, the step 902 sets the pattern number to be PN=5. The processor 20 has an area in its RAM corresponding to the latch register 802, and when the processor intends to set data in the latch register 802, the contents of the area (will be termed "output buffer") are set in the latch register 802. In the process of FIG. 17, only a necessary pattern portion of the output buffer is updated, with remaining portions being retained unchanged, and the whole data is transferred to the latch register 802. A specific pattern is searched by making reference to the pattern number PN.

Step 904 tests whether the pattern is a line graph. The coolant temperature is displayed in line graph, and it is processed in steps 906 through 914.

Step 906 calculates the length of the graph, i.e., the number of segments to be activated. The number of active segments SN is calculated by dividing the input data DV by the constant SS which gives the temperature width represented by one segment, as:

$$SN=DV/SS \quad (1)$$

If the length of graph is not proportional to the input value DV, the step 904 makes a negative decision.

Step 908 looks up table 1 in ROM, in which the relation of Table 1 is store, with a variable of color data. When "white" is specified, a set of data "0011" is read out from Table 1, or when "red" is specified, "0111" is read out. To read out sets of data equal in number to segments displayed, the number of active segments SN is counted down in step 910. The count SN reaches zero as detected in step 912 when drive signals for all color segments to be displayed are read out. The step 910 also decrements the maximum number of segments SF of the pattern. The value SF subtracted by SN is the number of segments left deactivated in black.

When step 912 makes an affirmative decision, SN has a zero value and SF is equal to the number of inactive segments. Step 914 searches the Table 1 for a set of "black" data which is "0000" as shown in Table 1. Step 910 further decrements SN into a negative value, and the step 912 makes an affirmative decision invariably. Accordingly, the processing loop including steps 910, 912, 914 and 916 is cycled, and data "0000" is read out for a number of times equal to the number of inactive segments. When SF reaches zero, the whole data which has been read out in steps 908 and 914 is set in the output buffer at a location of PN=5 in step 918.

Step 920 transfers data in the output buffer to the latch register 802 over a bus line 806. In case the processor has no parallel output port, the contents of the output buffer are clocked into a shift register 804 from the processor serial output port. Dashed line 810 indicates the serial output path to the shift register and dashed line 808 indicates the clock path for supplying a shift clock pulses to the shift register. Upon completion of data transfer to the shift register 804, a latch signal is issued to the latch register 802 over line 814, and the contents of the shift register are transferred in parallel to the latch register 802 over output lines 212.

Next, the processing for display data in other mode will be described in connection with FIG. 17. In this case, the correspondence between display data and segments of patterns to be activated, as shown in Table 2, is stored in advance in ROM of the processor 20.

TABLE 2

| Patterns | | Segments<br>1 2 3 4 5 6 7 8 ... [SN] |
|---|---|---|
| PN = 2<br>Vehicle<br>speed | 100th digit: 0 (km/h) | 0 E |
| | 100th digit: 1 (100 km/h) | 1 E |
| | 10th digit: 0 (km/h) | 1 1 1 0 1 1 1 E |
| | 10th digit: 1 (10 km/h) | 1 1 0 0 0 0 0 E |
| | 10th digit: 2 (20 km/h) | 0 1 1 1 1 1 1 E |
| | . | . |
| | . | . |
| | Unit digit: 0 | 1 1 1 0 1 1 1 E |
| | . | . |
| | . | . |
| PN = 3<br>Left turn<br>sign | — | 1 E |
| PN = 6<br>Engine<br>speed | 0 (RPM) | 1 1 1 0 1 1 1 E |
| | . | . |
| | . | . |
| | . | . |

For example, to have a numerical display for the vehicle speed as a result of processing in FIG. 5, step 926 looks up Table 2 using data of vehicle speed, e.g., 120 km/h. The vehicle speed has a pattern number of PN=2, and the section of PN=2 in the table is searched for display data for 120 km/h. Namely, the 100th digit of data is "1", the 10th digit is "2" and the unit digit is "0", and correspondingly data "1E0111111E1110111E" is retrieved from Table 2. Step 928 tests whether the leading bit of data is "1" or "0". If it is found "1", step 930 reads out color data and holds it as in step 908. If it is found "0", step 932 reads out "black" data "0000" and holds it. The subsequent step 934 decrements SN to examine the next segment. Bit value "E" in Table 2 indicates the linkage of segments and does not relate directly to the display operation. Then, the bit of "E" is skipped, and the subsequent "0" is detected in step 928.

In this way, the activation or deactivation and the display color are determined for all segments. When step 936 detects the completion of this processing, SN is reset to the initial value in step 938, and the sequence proceeds to step 918. The step 918 sets data which has been read out in steps 930 and 932 in the output buffer at a location specified by PN. Thereafter the data is transferred to the latch register in step 920.

Figure 18:
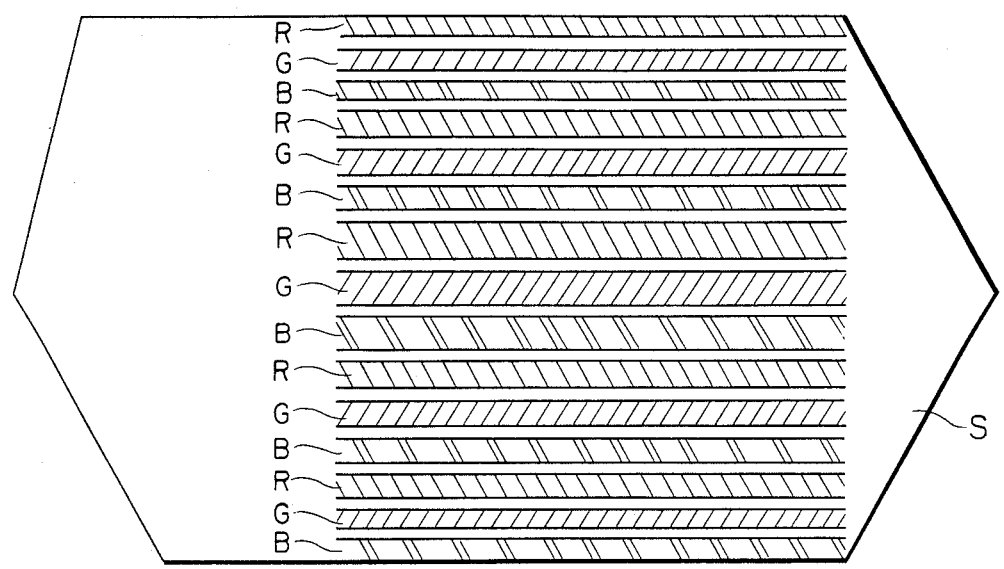
FIG. 18 is a plan view of part of the display panel, showing another embodiment of the electrode structure.

FIG. 18 shows another embodiment of the liquid crystal display panel applicable to the arrangements of FIGS. 1, 6, 8, 11, 12, 13 and 15. In this panel structure, line electrodes R, G and B constituting a segment S are narrowed progressively as they approach the edges from the center of the segment. This structure provides a three-dimensional appearance for displayed character patterns, resulting in an improved legibility. Moreover, the profile of patterns is clarified. The ratio of the maximum to minimum width of each line electrode is preferably 4:1 to 8:1. The same effect is expected for the electrode arrangement of FIG. 13 by employment of tapered line electrodes as shown in FIG. 18. The electrode arrangement of FIG. 18 provides enhanced legibility, while using less number of electrodes.

Figure 19:
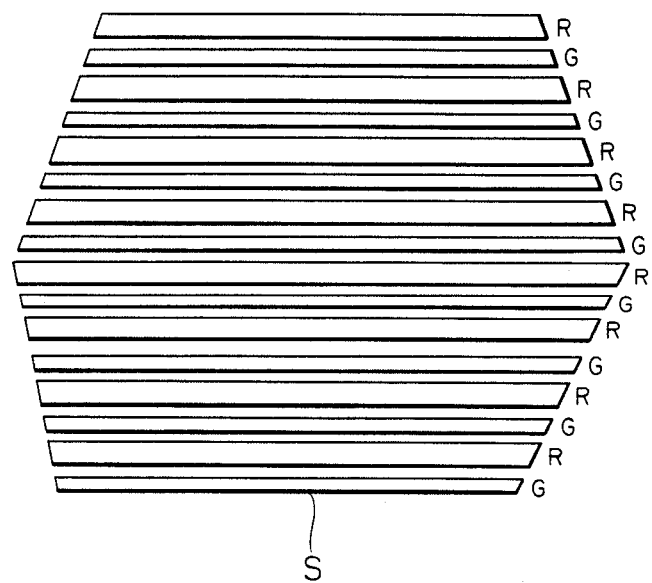
FIG. 19 is a plan view showing still another embodiment of the electrode structure.

FIG. 19 shows another embodiment of the liquid crystal panel structure applicable to the arrangements of FIGS. 1, 6, 8, 11, 12, 13 and 15. In this layout of a segment, line electrodes are provided with different widths depending on the color of associated filters. Although the embodiment shown is of only two colors, red and green, for the clarification purpose, the principle is equally applicable to a three-color panel. Because of different amounts of light transmitted through the red and green filters, a red display is darker than a green display. In order to have equal intensities for red and green so that, for example, the concurrent activation of both electrodes results in the orange color, the electrode for the red filter needs to have an expanded with. To clarify the intermediate tone, it is preferable for the red electrode to have a width 1.5 to 2 times that of the green electrode. If it is intended to emphasize red for displaying alarms, the red electrode needs a more expanded width. Preferably, the width of electrode for each color is determined basing on the measurement of light transmission through each color filter.

Figure 20:
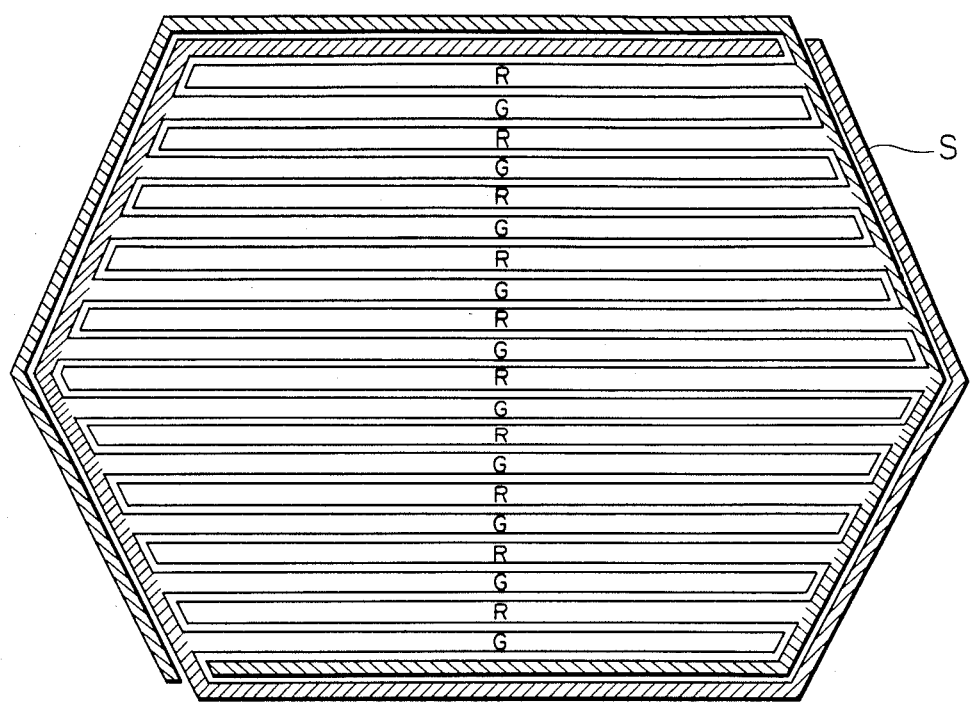
FIG. 20 is a plan view showing further embodiment of the electrode structure.

FIG. 20 shows a modified embodiment based on FIG. 19 for clarifying the profile of each segment. In this segment layout, some line electrodes are placed along the profile of a segment which is made up of line electrodes of several kinds of color. This simple panel structure enables a liquid crystal display panel of a type of variable color to make a display with a three-dimensional appearance and enhanced legibility.

According to the present invention, the number of electrode lead lines is decreased and the circuit arrangement is simplified. A smaller number of lead lines alleviates the occurrence of erroneous activation of liquid crystal, and it can more easily be removed by means of that simple mask covers over the electrodes.

We claim:

1. A liquid crystal display system comprising:
   a display control circuit which produces display signals for displaying at least a fixed image pattern on a liquid crystal panel in a plurality of colors;
   first and second electrodes confronting each other with a liquid crystal disposed therebetween; and
   a drive circuit for activating said first and second electrodes in response to display signals provided by said display control circuit;
   said fixed image pattern including a plurality of segments formed of a plurality of said first and second electrodes, said drive circuit simultaneously driving said plurality of segments to enable display of said fixed image pattern in a desired color;
   at least one of said first and second electrodes being constructed as a plurality of adjacent thin line electrode strips, the thin line electrode strips of the at least one of said first and second electrodes having different widths;
   color filters being provided one of on the thin line electrode strips of the at least one of said first and second electrodes and at corresponding positions on the other of said first and second electrodes in a certain cyclic order of colors so that the color filters are interleaved, and
   said drive circuit operating to simultaneously activate selected ones of the thin line electrode strips selectively in response to color control signals provided by said display control circuit so as to enable display of said fixed image pattern in the desired color;
   whereby the color display of the fixed image pattern has at least one of a predetermined intensity in dependence on the width of the activated thin line electrode strips associated with the desired color and a three-dimensional appearance with enhanced legibility.

2. A liquid crystal display system according to claim 1, wherein the thin line electrode strips of a segment of said pattern on said panel are arranged so that the widths of the thin line electrode strips at the center of the segment are different than the widths of the thin line electrode strips at hte edges of the segment.

3. A liquid crystal display system according to claim 2, wherein the widths of the thin line electrode strips vary progressively from the center of the segment to the edge. of the segment.

4. A liquid crystal display system accordintg to claim 3, wherein the widths of the thin line electrode strips progressively decrease from the center of the segment to the edges of the segment.

5. A liquid crystal display system according to claim 3, wherein the widths of the thin electrode strips progressively increase from the center of the segment to the edges of the segment.

6. A liquid crystal display system according to claim 2, wherein the thin line electrode strips of each different width have different color filters associated therewith.

7. A liquid crystal display system according to claim 6, wherein respective thin line electrode strips of one width have respective different color filters associated therewith, and respective thin line electrode strips of another width have respective different color filters associated therewith.

8. A liquid crystal display system according to claim 1, wherein the thin line electrode strips of a segment of said pattern on said panel are arranged so that the thin line electrode strips of a respective one of each different width is associated with a respective one of each different color filter.

9. A liquid crystal display system according to claim 8, wherein the thin line electrode strips are formed of at least a first and a second width, the thin line electrode strips of the first width being associated with one color filter and the thin electrode strips of the second width being associated with another color filter.

10. A liquid crystal display system according to claim 1, wherein the thin line electrode strips of a segment of said pattern on said panel are arranged so that a first plurality of the thin line electrode strips of the segment extend from a profile of the segment.

11. A liquid crystal display system according to claim 10, wherein a second plurality of the thin line electrode strips are arranged to extend from another profile of the segment so that an interleaved relationship of the first plurality of the thin line electrode strips and the second plurality of the thin electrode strips is provided.

12. A liquid crystal display sytsem according to claim 1, wherein both said first and second electrodes are constructed as a plurality of thin line electrode strips of different widths, the thin line electrode strips of one of said first and second electrodes having different color filters provided thereon, the thin line electrode strips being formed of at least a first width and a second width, the first width being wider than the second width, a thin line electrode strip of the first width of said first electrode being arranged to confront a thin line electrode strip of the second width of said second electrode and to confront a portion of a thin line electrode strip of the first width of said second electrode, another portion of the thin line electrode strips of the first with of said second electrode being arranged to confront a thin line electrode strip of the second width of said first electrode, the thin line electrode strip of the first width of the one of the first and second electrodes being provided thereon with two different color filters separated from one another, and the thin line electrode strip of the second width of said first and second electrodes being provided thereon with a third different color filter.

13. A liquid crystal display system according to claim 12, wherein the thin line electrode strips of the first width of the one of said first and second electrodes is provided with a green color filter and a blue color filter separated from one another and the thin line electrode strips of the second width of the one of said first and second electrodes is provided with a red color filter thereon.

14. A liquid crystal display system according to claim 1, wherein said display control circuit includes color decoder means for decoding color data supplied thereto and for generating color signals for said drive circuit so as to enable activation of said first and second electrodes for color display.

15. A liquid crystal display system according to claim 14, further comprising color register means for receiving and storing color data signals for application to said color decoder means.

16. A liquid crystal display system according to claim 14, further comprising pattern decoder means for decoding pattern data and for generating pattern signals for said drive circuit so as to activate said first and second electrodes for enabling pattern display, said drive circuit including gating means responsive to the signals from said pattern decoder means and the signals from said color decoder means for controlling activation of said first and second electrodes in accordance therewith.

17. A liquid crystal display system according to claim 16, further comprising color register means for receiving and storing color data signals for application to said color decoder means.

18. A liquid crystal display system according to claim 14, wherein the thin line electrode strips of the at least one said first and second electrodes have different widths.

* * * * *